(12) United States Patent
Arimitsu

(10) Patent No.: US 12,206,333 B2
(45) Date of Patent: Jan. 21, 2025

(54) HIGH VOLTAGE AMPLIFIER CIRCUIT AND ANALYZER APPARATUS

(71) Applicant: JEOL Ltd., Tokyo (JP)

(72) Inventor: Masahiro Arimitsu, Tokyo (JP)

(73) Assignee: JEOL Ltd., Tokyo (JP)

( * ) Notice: Subject to any disclaimer, the term of this patent is extended or adjusted under 35 U.S.C. 154(b) by 237 days.

(21) Appl. No.: 17/980,653

(22) Filed: Nov. 4, 2022

(65) Prior Publication Data

US 2023/0148109 A1    May 11, 2023

(30) Foreign Application Priority Data

Nov. 5, 2021 (JP) ................................. 2021-181024

(51) Int. Cl.
*H02M 3/158* (2006.01)
*H01J 37/248* (2006.01)

(52) U.S. Cl.
CPC ......... *H02M 3/1584* (2013.01); *H01J 37/248* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30;

(Continued)

(56) References Cited

U.S. PATENT DOCUMENTS 4,030,041 A  *  6/1977  Sasaki .................... H03F 3/387
                                                              330/10
4,686,365 A      8/1987  Meek et al.
(Continued)

FOREIGN PATENT DOCUMENTS

JP    S61203554 A    9/1986
JP    H0997924 A    4/1997
(Continued)

OTHER PUBLICATIONS

Office Action issued in JP2021181024 on Oct. 24, 2023.
Extended European Search Report issued in EP22204380.4 on Mar. 27, 2023.

*Primary Examiner* — Jeffrey A Gblende
(74) *Attorney, Agent, or Firm* — The Webb Law Firm

(57) ABSTRACT

An amplifier circuit includes a constant current circuit for outputting a constant current signal at its output terminal, an operational amplifier for outputting an amplified control signal based on the first voltage signal, and an amplified voltage output circuit for outputting a second voltage signal based on both the constant current signal and the amplified control signal. The constant current circuit has a light-emitting device having one end supplied with the constant voltage signal and another end supplied with ground potential, a light responsive electricity generating device for outputting a drive signal in response to light emitted by the light-emitting device, a first transistor generating the constant current signal based on the amplified voltage signal applied thereto and to output the constant current signal; and a current control circuit for detecting the value of the constant current signal and controlling the supply of the drive signal based on the detection.

5 Claims, 3 Drawing Sheets

(58) Field of Classification Search
CPC ... G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H02M 1/0009; H02M 1/08; H02M 1/088; H02M 1/0048; H05B 39/048; B23K 11/24; H04B 2215/069; H01J 37/00; H01J 37/248

See application file for complete search history.

(56) References Cited

U.S. PATENT DOCUMENTS

| | | | |
|---|---|---|---|
| 5,734,170 | A | 3/1998 | Ikeda |
| 6,563,379 | B1 | 5/2003 | Potucek |
| 9,413,352 | B2 * | 8/2016 | Lim ............... H05B 45/39 |
| 11,844,157 | B2 * | 12/2023 | Smith ............. H03F 1/523 |
| 2019/0393839 | A1 | 12/2019 | Ogura |
| 2023/0128678 | A1 * | 4/2023 | Tanino ............. H02M 1/32 |
| | | | 323/282 |

FOREIGN PATENT DOCUMENTS

| | | |
|---|---|---|
| JP | 200579925 A | 3/2005 |
| JP | 2012255784 A | 12/2012 |
| JP | 2019220857 A | 12/2019 |

* cited by examiner

HIGH VOLTAGE AMPLIFIER CIRCUIT AND ANALYZER APPARATUS

CROSS REFERENCE TO RELATED APPLICATION

This application claims priority to Japanese Patent Application No. 2021-181024, filed Nov. 5, 2021, the disclosure of which is hereby incorporated by reference in its entirety.

BACKGROUND OF THE INVENTION

1. Field of the Invention

The present invention relates to a high voltage amplifier circuit and an analyzer apparatus.

2. Description of the Related Art

A high voltage amplifier circuit is known which amplifies an input voltage signal of a few to tens of volts to a high voltage signal of a few kV and outputs it. For example, JP-A-2005-079925 discloses a high output DC amplifier circuit (high voltage amplifier circuit) which has an operational amplifier receiving a voltage signal and a push-pull circuit for amplifying the output signal from the operational amplifier and outputting a high voltage signal and which can output a high voltage signal of a desired voltage value by feeding the high voltage signal from the push-pull circuit back to the operational amplifier via a resistive element.

In the high voltage amplifier circuit set forth in JP-A-2005-079925, a push-side field-effect transistor included in the push-pull circuit is driven based on the output current from a push-side photocoupler 13A. However, the output current from the push-side photocoupler 13A is feeble and, therefore, it takes time to electrically charge the input capacitance of the push-side field-effect transistor. Therefore, in the high voltage amplifier circuit set forth in JP-A-2005-079925, it is difficult to produce the high voltage signal at a higher response speed when there is a request for a variation of the voltage value of the high voltage signal.

SUMMARY OF THE INVENTION

In view of the problems described thus far, the present invention has been made. According to some aspects of the present invention, a high voltage amplifier circuit and an analyzer apparatus can be offered which respond at higher speeds.

One aspect of the high voltage amplifier circuit associated with the present invention is designed to amplify a first voltage signal applied to an input terminal and to output at an output terminal a second voltage signal of a few kV or higher and comprises a constant current circuit for outputting a constant current signal at the output terminal, an operational amplifier for outputting an amplified control signal based on the first voltage signal, and an amplified voltage output circuit for outputting the second voltage signal based on the constant current signal and on the amplified control signal. The constant current circuit has: a light-emitting device having one end supplied with the constant voltage signal and another end supplied with ground potential; a light responsive electricity generating device for outputting a drive signal in response to light emitted by the light-emitting device; a first transistor having a first terminal, a second terminal, and a third terminal and operating, in response to the drive signal supplied to the first terminal, to generate the constant current signal based on the amplified voltage signal applied to the second terminal and to output the constant current signal at the third terminal; and a current control circuit for detecting the electrical current value of the constant current signal outputted at the third terminal and controlling the supply of the drive signal to the first terminal based on the detection.

In this high voltage amplifier circuit, the constant voltage signal continues to be supplied to the light-emitting device and so the light responsive electricity generating device continues to generate the drive signal and outputs it to the first transistor. Consequently, electrical charge is continually stored in the input capacitance of the first transistor which outputs the constant current signal at its output terminal. Thus, if there is a request for a variation of the voltage value of the second voltage signal from the high voltage amplifier circuit and if the voltage value of the first voltage signal applied to the input terminal varies, the time taken to store electrical charge in the input capacitance of the first transistor can be shortened. Also, the responsiveness to a request for a variation of the voltage value of the second voltage signal provided by the high voltage amplifier circuit can be enhanced.

Furthermore, in this high voltage amplifier circuit, the constant voltage signal is constantly supplied to the light-emitting device and, therefore, the light responsive electricity generating device continues to generate the drive signal. Consequently, the constant current circuit can be operated without using a high voltage resistance floating power supply. This can suppress the circuit size of the high voltage amplifier circuit. Also, this prevents injection of coupling noise which would occur when a high voltage resistance floating power supply is used.

In addition, in this high voltage amplifier circuit, the constant current circuit outputs at the output terminal a constant current signal based on the amplified voltage signal. This reduces the possibility that the responsiveness to a request for a variation of the voltage value of the second voltage signal delivered by the high voltage amplifier circuit will be varied by a load capacitance connected to the high voltage amplifier circuit. Also, this decreases the possibility that the circuit loss will be increased by variations in the load capacitance connected to the high voltage amplifier circuit.

One aspect of the analyzer apparatus associated with the present invention includes the high voltage amplifier circuit described in the immediately preceding paragraph.

This analyzer apparatus has the high voltage amplifier circuit capable of providing improved responsiveness to a request for a variation of the voltage value of the second voltage signal. Therefore, when an analysis is performed, a wait time for a response can be shortened.

As a result, the analysis can be hastened.

Furthermore, this analyzer apparatus having the high voltage amplifier circuit is suppressed in circuitry size. If a high voltage resistance floating power supply is used, injection of coupling noise can be suppressed.

DESCRIPTION OF THE INVENTION

The preferred embodiments of the present invention are hereinafter described in detail with reference to the drawings, which are only for illustrative convenience. It is to be understood that the embodiments set forth below are not intended to unduly restrict the content of the present invention delineated by the claims and that not all the configurations set forth hereinafter are essential constituent components of the present invention.

1. High Voltage Amplifier Circuit 1.1 First Embodiment

Figure 1:
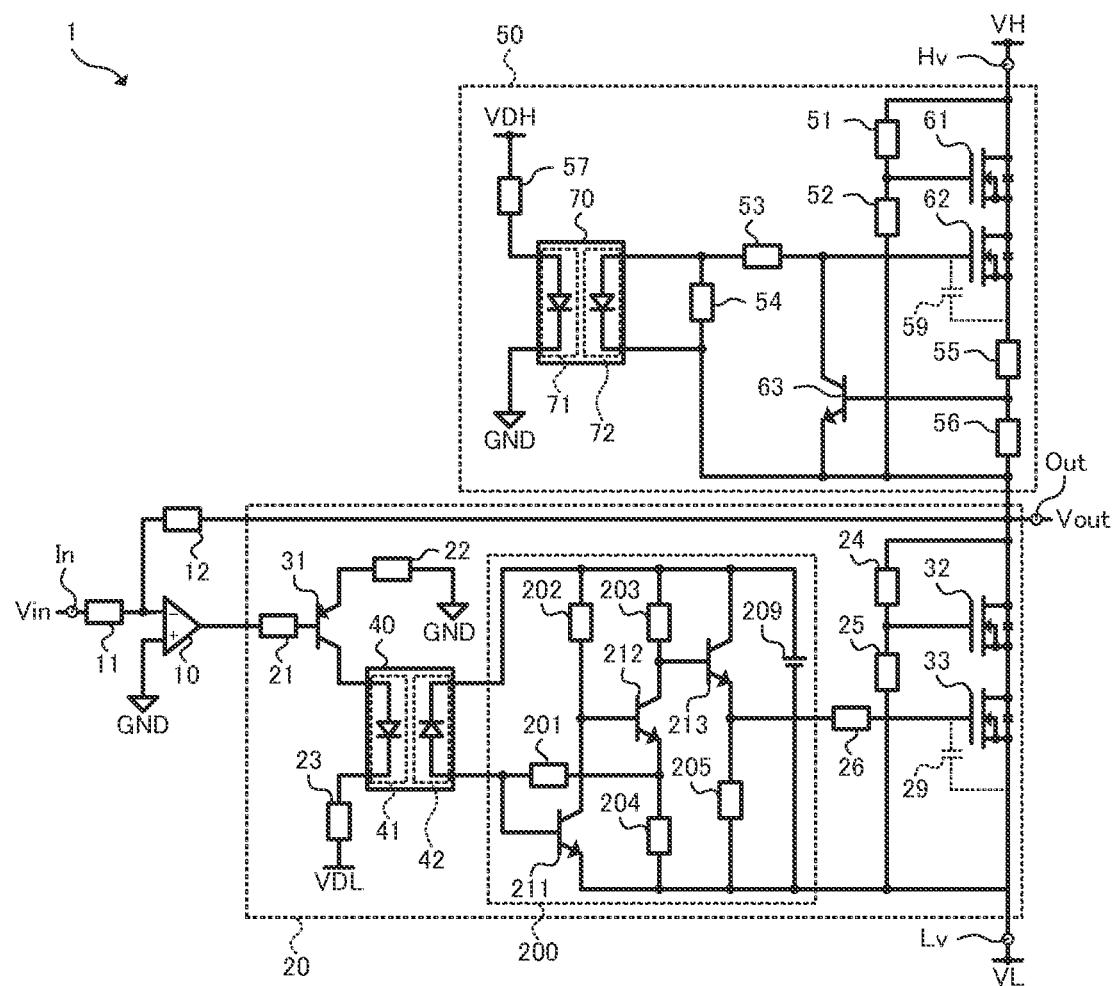
FIG. 1 is a diagram showing one example of the configuration of a high voltage amplifier circuit 1 of a first embodiment of the present invention.

FIG. 1 is a diagram showing one example of the configuration of a high voltage amplifier circuit, 1, of a first embodiment of the present invention. As shown, the high voltage amplifier circuit 1 comprises an operational amplifier 10, an amplified voltage output circuit 20, and a constant current circuit 50. The high voltage amplifier circuit 1 has a terminal In and another terminal Out. An input voltage Vin is applied to the terminal In and amplified by the high voltage amplifier circuit 1. An output voltage Vout of a few kV or higher is output at the terminal Out. The high voltage amplifier circuit 1 provides or can provide the output voltage Vout of a few kV or higher.

In particular, the constant current circuit 50 equipped in the high voltage amplifier circuit 1 generates a constant current signal based on a voltage signal VH applied to a terminal Hv and outputs the constant current signal at the terminal Out. The operational amplifier 10 of the high voltage amplifier circuit 1 outputs an amplified control signal based on the input voltage Vin applied to the terminal In. The amplified voltage output circuit 20 of the high voltage amplifier circuit 1 generates the output voltage Vout based on the amplified control signal from the operational amplifier 10 and on the constant current signal from the constant current circuit 50 and outputs the output voltage Vout at the terminal Out. That is, the high voltage amplifier circuit 1 has the constant current circuit 50 for outputting the constant current signal at the terminal Out, the operational amplifier 10 for outputting the amplified control signal based on the input voltage Vin, and the amplified voltage output circuit 20 for outputting the output voltage Vout based on the amplified control signal from the operational amplifier 10 and on the constant current signal from the constant current circuit 50.

The configuration of the high voltage amplifier circuit 1 designed as described so far is described in detail with reference to FIG. 1. As shown, the constant current circuit 50 has resistors 51-57, transistors 61-63, and a photocoupler 70. The transistors 61 and 62 of the first embodiment are N-channel MOS transistors, while the transistor 63 is an NPN bipolar transistor. Also shown in FIG. 1 is an electrical capacitance 59 present between the gate and source terminals of the transistor 62.

The photocoupler 70 includes a light-emitting diode 71 and a photoelectric converter 72. The light-emitting diode 71 has an anode terminal to which a voltage signal VDH is supplied via the resistor 57, the voltage signal VDH being a DC voltage signal, for example, of +15 V. The light-emitting diode 71 also has a cathode terminal to which ground potential GND is supplied.

The photoelectric converter 72 includes one or more photodiodes. If the photoelectric converter 72 includes a single photodiode, the anode and cathode terminals of the photodiode are electrically connected with an electronic part mounted outside of the photoelectric converter 72. On the other hand, if the photoelectric converter 72 includes a plurality of photodiodes, these photodiodes are connected in series such that the anode terminal of one of any two successive photodiodes and the cathode terminal of the other are connected together and that the anode terminal of the photodiode located at one end of the series combination of the photodiodes and the cathode terminal of the photodiode located at the other end are electrically connected with the electronic part mounted outside of the photoelectric converter 72. The anode terminal of the photodiode located at one end either of one photodiode or of the series combination of plural photodiodes is hereinafter referred to as the "anode terminal of the photoconverter 72", and the cathode terminal located at the other end is hereinafter referred to as the "cathode terminal of the photoelectric converter 72".

The anode terminal of the photoelectric converter 72 is electrically connected with one end of the resistor 53 and with one end of the resistor 54. The cathode terminal of the photoelectric converter 72 and the other end of the resistor 54 are electrically connected with the terminal Out. That is, the photoelectric converter 72 and the resistor 54 are connected in parallel.

The other end of the resistor 53 is electrically connected with the gate terminal of the transistor 62. The drain terminal of the transistor 62 is electrically connected with the source terminal of the transistor 61, while the source terminal of the transistor 62 is electrically connected with one end of the resistor 55. The electrical capacitance 59 is present between the gate and source terminals of the transistor 62. The electrical capacitance 59 is equivalent to the input capacitance of the transistor 62.

The drain terminal of the transistor 61 is electrically connected with one end of the resistor 51 and with the terminal Hv. The gate terminal of the transistor 61 is electrically connected with the other end of the resistor 51 and with one end of the resistor 52. The other end of the resistor 52 is electrically connected with the terminal Out.

The other end of the resistor 55 is electrically connected with one end of the resistor 56, the other end of the resistor 56 being electrically connected with the terminal Out. The other end of the resistor 55 and one end of the resistor 56 are electrically connected with the base terminal of the transistor 63. The collector terminal of the transistor 63 is electrically connected with the gate terminal of the transistor 62. The source terminal of the transistor 63 is electrically connected with the terminal Out.

The operation of the constant current circuit 50 constructed as described thus far is now described. In the constant current circuit 50, the voltage signal VDH is supplied to the light-emitting diode 71 of the photocoupler 70. As a result, the light-emitting diode 71 emits light according to the amount of current produced in response to the voltage signal VDH. The photoelectric converter 72 of the photocoupler 70 receives the light emitted from the light-emitting diode 71 and outputs a current corresponding to the amount of light from the light-emitting diode 71. The voltage signal VDH is continuously supplied to the light-emitting diode 71 of the present embodiment. Therefore, the photoelectric converter 72 continues to output an electrical current irrespective of the operation of the high voltage amplifier circuit 1.

The output current from the photoelectric converter 72 is supplied to the electrical capacitance 59 via the resistor 53 and thus electrical charge is stored in the electrical capacitance 59. As a result, a voltage determined by both the amount of current delivered by the photoelectric converter 72 and the resistance value of the resistor 54 is supplied to the gate terminal of the transistor 62. In consequence, an electrical current induced by the voltage signal VH flows between the drain and source terminals of the transistor 62 and between the drain and source terminals of the transistor 61.

This current induced by the voltage signal VH and flowing between the drain and source terminals of the transistor 61 and between the drain and source terminals of the transistor 62 is supplied to the terminal Out via the resistors 55 and 56. This induces a voltage across the resistor 56 according to both the current induced by the voltage signal VH and the resistance value of the resistor 56. If the voltage developed across the resistor 56 exceeds a threshold value for the transistor 63, then an electrical current is induced between the collector and emitter terminals of the transistor 63. This controls the voltage value supplied to the gate terminal of the transistor 62 electrically connected with the collector terminal of the transistor 63. As a result, the value of the current flowing between the drain and source terminals of the transistor 62 is limited.

That is, the constant current circuit 50 has: the light-emitting diode 71 whose one end is supplied with the voltage signal VDH and whose other end is supplied with ground potential GND; the photoelectric converter 72 outputting an electrical current according to light emitted by the light-emitting diode; the transistor 62 which is energized according to the output current of the photoelectric converter 72 supplied to the gate terminal of the transistor 62 and which outputs an electrical current at its source terminal, the current being induced by the voltage signal VH applied to the drain terminal; a combination of the resistor 56 and the transistor 63 used for both detection of the electrical current value of the signal induced by the voltage signal VH delivered from the source terminal of the transistor 62 and control of the supply of current and voltage to the gate terminal of the transistor 62 based on the detection.

That is, the constant current circuit 50 detects, through the resistor 56, the value of current flowing between the drain and source terminals of the transistor 62 and controls the operation of the transistor 63 according to the detection performed through the resistor 56, whereby the amount of current flowing between the drain and source terminals of the transistor 62 is controlled constant. The constant current circuit 50 outputs the current at the terminal Out, the current flowing between the drain and source terminals of the transistor 62 whose amount of current is controlled constant. The electrical current flowing between the drain and source terminals of the transistor 62 whose amount of current is controlled constant is equivalent to a constant current signal.

The transistor 61 is mounted to secure a sufficient withstand voltage between the terminals Hv and Out. Therefore, the constant current circuit 50 may have a plurality of transistors 61 or no transistor 61 according to both the voltage value of the voltage signal VH and the withstand voltage of the transistor 62. In the foregoing description of the present embodiment, the light-emitting diode 71 and the photoelectric converter 72 are contained in the single photocoupler 70. Alternatively, the light-emitting diode 71 and the photoelectric converter 72 may be separate electronic parts.

The configurations and operations of the operational amplifier 10 and of the amplified voltage output circuit 20 are next described. As shown in FIG. 1, the operational amplifier 10 has a negative input terminal which is electrically connected with the terminal In via the resistor 11 and with the terminal Out via the resistor 12. The operational amplifier 10 also has a positive input terminal to which ground potential GND is supplied. The output terminal of the operational amplifier 10 is electrically coupled to the amplified voltage output circuit 20.

The amplified voltage output circuit 20 has resistors 21-26, 201-205, transistors 31-33, 211-213, a photocoupler 40, and a power supply 209. The transistor 31 of the present embodiment is a PNP bipolar transistor. The transistors 32 and 33 are N-channel MOS transistors. The transistors 211-213 are NPN bipolar transistors. Also shown in FIG. 1 is an electrical capacitance 29 present between the gate and source terminals of the transistor 33.

The output terminal of the operational amplifier 10 is electrically connected with one end of the resistor 21 whose other end is electrically connected with the base terminal of the transistor 31. Ground potential GND is supplied to the emitter terminal of the transistor 31 via the resistor 22. The collector terminal of the transistor 31 is electrically connected with the photocoupler 40.

The photocoupler 40 includes a light-emitting diode 41 and a photoelectric converter 42. The light-emitting diode 41 has an anode terminal electrically connected with the collector terminal of the transistor 31. The cathode terminal of the light-emitting diode 41 is supplied with a voltage signal VDL via the resistor 23. The voltage signal VDL is a DC voltage signal of −15 V, for example.

The photoelectric converter 42 includes one or more photodiodes. If the photoelectric converter 42 includes a single photodiode, then the anode and cathode terminals of this photodiode are electrically connected with an electronic part mounted outside of the photoelectric converter 42. On the other hand, if the photoelectric converter 42 includes a plurality of photodiodes, then these photodiodes are connected in series such that the anode terminal of one of any two successive photodiodes and the cathode terminal of the other are connected together and that the anode terminal of the photodiode located at one end of the series combination of the photodiodes and the cathode terminal of the photodiode located at the other end are electrically connected with the electronic part mounted outside of the photoelectric converter 42. The anode terminal of the photodiode located at one end either of one photodiode or of the series combination of plural photodiodes is hereinafter referred to as the "anode terminal of the photoconverter 42", and the cathode terminal of the photodiode located at the other end is hereinafter referred to as the "cathode terminal of the photoelectric converter 42".

The anode terminal of the photoelectric converter 42 is electrically connected with one end of the resistor 201 and with the base terminal of the transistor 211. The cathode terminal of the photoelectric converter 42 is electrically connected with all of one end of the resistor 202, one end of the resistor 203, the collector terminal of the transistor 213, and the positive terminal of the power supply 209. The negative terminal of the power supply 209 is electrically connected with a terminal Lv.

The other end of the resistor 202 is electrically connected with the collector terminal of the transistor 211, while the emitter terminal of the transistor 211 is electrically connected with the terminal Lv. The other end of the resistor 202 is also electrically connected with the base terminal of the transistor 212.

The other end of the resistor 203 is electrically connected with the collector terminal of the transistor 212 and with the base terminal of the transistor 213. The emitter terminal of the transistor 212 is electrically connected with the other end of the resistor 201 and with one end of the resistor 204. The other end of the resistor 204 is electrically connected with the terminal Lv.

The emitter terminal of the transistor 213 is electrically connected with one end of the resistor 205 whose other end is electrically connected with the terminal Lv. The emitter terminal of the transistor 213 is also electrically connected with one end of the resistor 26.

The resistors 201-205, transistors 211-213, and power supply 209 constructed as described thus far operate together to convert the output current from the photocoupler 40 into a voltage. In particular, the conduction states of the transistors 211-213 dynamically vary according to the amount of current of the output current from the photocoupler 40. As a result, a voltage is developed across the resistor 205 based on the value of the output current from the photocoupler 40 and on the value of the output value from the power supply 209. The voltage developed across the resistor 205 is applied to one end of the resistor 206. The resistors 201-205, transistors 211-213, and power supply 209 together operate to convert the output current from the photocoupler 40 into a voltage and are herein collectively referred to as a voltage-to-current (I/V) converter circuit 200. In other words, the I/V converter circuit 200 converts an electrical current based on the output voltage from the operational amplifier 10 into a voltage.

The output voltage from the operational amplifier 10 is equivalent to an amplified control signal. The output current delivered from the photoelectric converter 42 included in the photocoupler 40 in response to the output voltage from the operational amplifier 10 is equivalent to an amplified control current signal. The output voltage from the I/V converter circuit 200 which converts the output current from the photoelectric converter 42 included in the photocoupler 40 is equivalent to an amplified control voltage signal.

The other end of the resistor 26 is electrically connected with the gate terminal of the transistor 33. The drain terminal of the transistor 33 is electrically connected with the source terminal of the transistor 32, while the source terminal of the transistor 33 is electrically connected with the terminal Lv. The electrical capacitance 29 is present between the gate and source terminals of the transistor 33 and equivalent to the input capacitance of the transistor 33.

The drain terminal of the transistor 32 is electrically connected with one end of the resistor 24 and with the terminal Out. The gate terminal of the transistor 32 is electrically connected with the other end of the resistor 24 and with one end of the resistor 25. The other end of the resistor 25 is electrically connected with the terminal Lv.

The operations of the operational amplifier 10 and the amplified voltage output circuit 20 configured as described thus far are now described. The operational amplifier 10 outputs a voltage at its output terminal, the voltage having a value stipulated based on (i) the input voltage Vin applied at the terminal In, (ii) the output voltage Vout appearing at the terminal Out, and (iii) the values of the resistors 11, 12. The output voltage from the operational amplifier 10 is applied to the base terminal of the transistor 31 via the resistor 21.

The transistor 31 is controlled according to the value of the voltage applied to its base terminal such that conduction occurs between the emitter and collector terminals. Consequently, an amount of current corresponding to the value of the voltage supplied to the base terminal flows between the emitter and collector terminals of the transistor 31 and is supplied to the light-emitting diode 41 included in the photocoupler 40. As a result, the light-emitting diode 41 emits light, and the photoelectric converter 42 of the photocoupler 40 produces an output current corresponding to the amount of light from the light-emitting diode 41.

The output current from the photoelectric converter 42 is applied to the I/V converter circuit 200 and converted into a voltage of a value corresponding to the output current from the photoelectric converter 42. That is, the I/V converter circuit 200 converts a current based on the value of the voltage delivered from the operational amplifier 10 into a voltage. The output voltage from the I/V converter circuit 200 is supplied to the gate terminal of the transistor 33 via the resistor 26.

The transistor 33 is controlled by the output voltage from the I/V converter circuit 200 which is supplied to the gate terminal of the transistor 33 such that conduction occurs between the drain and source terminals. Furthermore, the transistor 33 is controlled such that conduction occurs between its drain and source terminals. This also controls the transistor 32 such that conduction occurs between its drain and source terminals. In this case, the amount of current flowing between the drain and source of the transistor 33 is stipulated by the value of the voltage which is output from the I/V converter circuit 200 and supplied to the gate terminal of the transistor 33. That is, the transistor 33 controls the amount of current which flows from the terminal Out toward the terminal Lv out of the current of the constant current signal supplied to the terminal Out by the constant current circuit 50 based on the output voltage from the operational amplifier 10, i.e., based on the output voltage from the I/V converter circuit 200. In consequence, the value of the output voltage Vout developed at the terminal Out is controlled.

If the value of the output voltage from the I/V converter circuit 200 increased in response to the output voltage from the operational amplifier 10, the amount of current flowing between the drain and source terminals of the transistor 33 increases. As a result, the voltage value developed at the terminal Out decreases toward the voltage value of the voltage signal VL. On the other hand, if the value of the output voltage from the I/V converter circuit 200 decreases in response to the output voltage from the operational amplifier 10, the amount of current flowing between the drain and source terminals of the transistor 33 decreases. As a result, the voltage value developed at the terminal Out increases toward the voltage value of the voltage signal VH.

That is, the amplified voltage output circuit 20 controls the amount of current flowing toward the terminal Lv out of the output current from the constant current circuit 50 in response to the output voltage from the operational amplifier 10, thus controlling the voltage value of the output voltage Vout developed at the terminal Out between the voltage value of the voltage signal VH and the voltage value of the voltage signal VL.

As described previously, the output voltage Vout produced at the terminal Out is fed back to the operational amplifier 10 via the resistor 12. The operational amplifier 10 controls the value of the output voltage from the output terminal of the operational amplifier 10 based on (i) the value of the input voltage Vin applied at the terminal In, (ii)

the value of the output voltage Vout fed back via the resistor 12, and (iii) the values of the resistors 11, 12. That is, the operational amplifier 10, amplified voltage output circuit 20, and resistors 11, 12 together constitute an inverting amplifier circuit. Thus, the high voltage amplifier circuit 1 amplifies the value of the input voltage Vin applied to the terminal In according to both the voltage value of the voltage signal VH and the voltage value of the voltage signal VL, thereby generating the output voltage Vout, and outputs this output voltage at the terminal Out. In particular, the high voltage amplifier circuit 1 generates the output voltage Vout whose value varies between the voltage signal VH on the order of kV applied via the terminal Hv and the voltage signal VL of a few negative kV applied via the terminal Lv in response to the input voltage Vin of ±tens of V and outputs the output voltage Vout at the terminal Out.

The terminal In is one example of an input terminal. The terminal Out is one example of an output terminal. The input voltage Vin applied to the high voltage amplifier circuit 1 at the terminal In is one example of a first voltage signal. The output voltage Vout delivered at the terminal Out is one example of a second voltage signal.

The light-emitting diode 71 included in the photocoupler 70 of the constant current circuit 50 is one example of a light-emitting device. The voltage signal VDH supplied to the anode terminal of the light-emitting diode 71 is one example of a constant voltage signal. The photoelectric converter 72 included in the photocoupler 70 is one example of a device which generates electricity in response to light. The output current from the photoelectric converter 72 is one example of a drive signal. A voltage developed across the resistor 54 in response to this output current is another example of a drive signal. The transistor 62 is one example of a first transistor. The gate terminal of the transistor 62 is one example of a first terminal. The drain terminal of the transistor 62 is one example of a second terminal. The source terminal of the transistor 62 is one example of a third terminal. The voltage signal VH supplied to the drain terminal of the transistor 62 via the transistor 61 is one example of an amplified voltage signal.

A configuration or combination including both the resistor 56 used to detect the amount of current flowing between the drain and source terminals of the transistor 62 and supplied to the terminal Out of the constant current circuit 50 and the transistor 63 controlling the supply of voltage to the gate terminal of the transistor 62 based on the detection performed using the resistor 56 is one example of a current control circuit. The transistor 33 whose drain terminal is electrically connected with the terminal Out via the transistor 32 is one example of a second transistor.

1.2 Advantageous Effects

In a conventional high voltage amplifier circuit, if an electric current needed to drive a MOS transistor is supplied from a photocoupler, the output current from the photocoupler is quite weak and, therefore, it takes a long time to store electrical charge in the input capacitance of the MOS transistor, making it difficult to achieve quick control of the high voltage amplifier circuit.

Faced with this problem, the high voltage amplifier circuit 1 of the present embodiment is so designed that a constant electrical current continues to be supplied to the electrical capacitance 59 via the photocoupler 70, the capacitance 59 being equivalent to the input capacitance of the transistor 62 of the constant current circuit 50, so that electrical charge is continually stored in the electrical capacitance 59. As a result, if the operational state of the high voltage amplifier circuit 1 varies, e.g., if the output voltage Vout from the amplifier circuit 1 is varied in value, it is not necessary to store electrical charge in the electrical capacitance 59 whenever such a variation is made. As a result, it is possible that the value of the output voltage Vout exhibits high responsiveness to the request for the variation.

From a viewpoint of enhancing the efficiency at which the input capacitance of a transistor is electrically charged, the use of a power supply circuit capable of producing large output currents may be possible, in which case a high voltage resistance floating power supply is needed and thus there arises a concern that the circuit size of the high voltage amplifier circuit may increase. Furthermore, the coupling capacitance of the floating power supply increases the possibility that noise enters the high voltage amplifier circuit.

On the other hand, in the high voltage amplifier circuit 1 of the present embodiment, electrical current is supplied to the constant current circuit 50 using the light-emitting diode 71 and the photoelectric converter 72 operating in response to the light emitted by the diode 71. Therefore, if the reference potential for operation of the constant current circuit 50 fluctuates, a large power circuit is not needed. As a result, the possibility that the high voltage amplifier circuit 1 increases in circuit size is reduced. Also, introduction of noise into the high voltage amplifier circuit 1 suppressed.

Furthermore, in the high voltage amplifier circuit 1 of the first embodiment, the amplified voltage output circuit 20 controls the amount of current flowing through the transistor 33, whereby the value of the output voltage Vout delivered at the terminal Out can be controlled. This suppresses the output voltage Vout from experiencing crossover distortion.

1.3 Second Embodiment

A high voltage amplifier circuit 1 of a second embodiment is next described. Those components of this high voltage amplifier circuit 1 of the second embodiment which are similar to their counterparts of the high voltage amplifier circuit 1 of the first embodiment are indicated by the same reference numerals as in the above referenced figures and any repetitive detailed description thereof will hereinafter be simplified or omitted.

Figure 2:
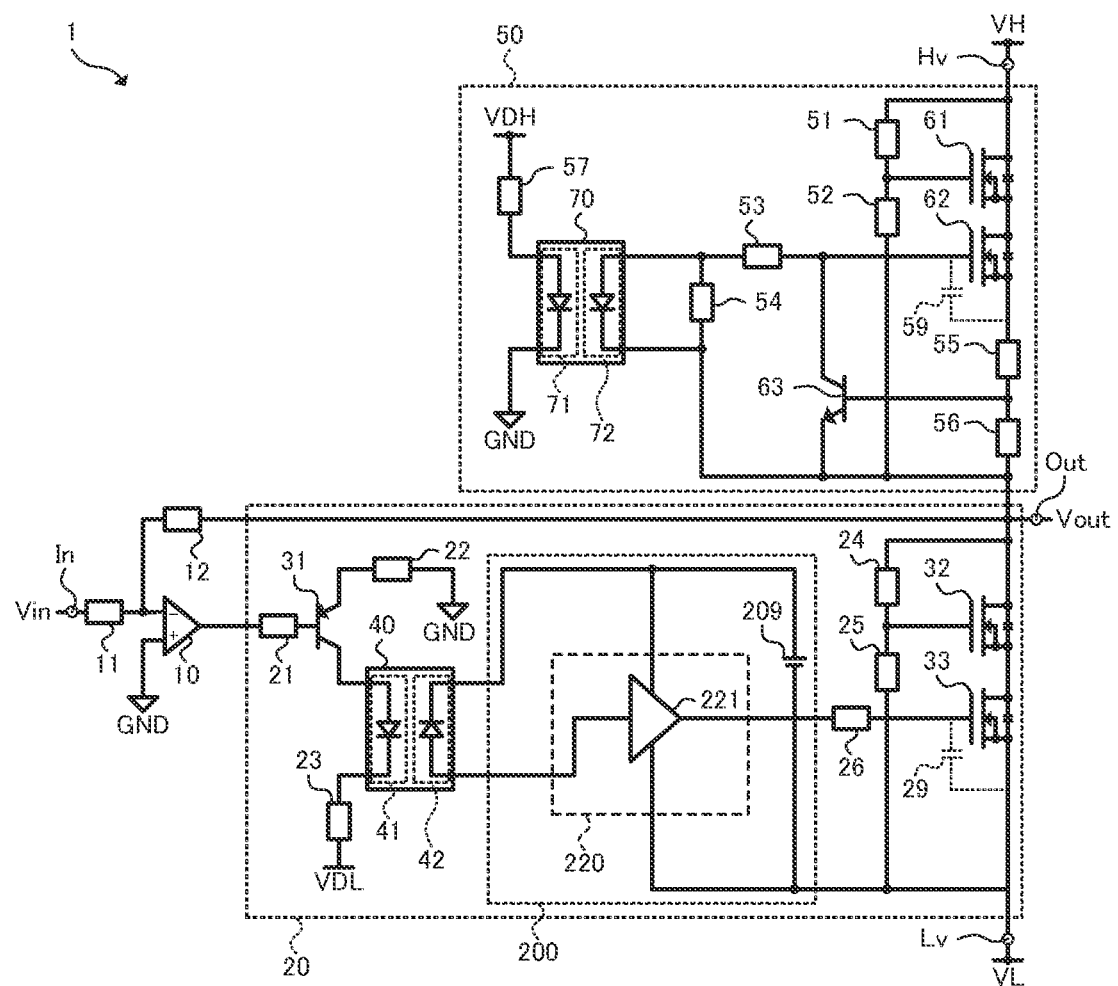
FIG. 2 is a diagram showing one example of the configuration of a high voltage amplifier circuit 1 of a second embodiment.

FIG. 2 shows one example of the configuration of the high voltage amplifier circuit 1 of the second embodiment. In the high voltage amplifier circuit 1 of the first embodiment shown in FIG. 1, the I/V converter circuit 200 is configured including the resistors 201-205 and the transistors 211-213. On the other hand, in the high voltage amplifier circuit 1 of the second embodiment, the I/V converter circuit 200 is configured from an integrated circuit system 220 including an operational amplifier 221. In other words, in the high voltage amplifier circuit 1 of the second embodiment, the I/V converter circuit 200 includes the integrated circuit system 220 having the operational amplifier 221.

Because the I/V converter circuit 200 is made of the single integrated circuit system 220, the converter circuit 200 is immune to noise. The accuracy of the voltage signal delivered to the transistor 33 by the I/V converter circuit 200 is improved. Also, the transistor 33 is driven with improved accuracy. In addition, the loss in the I/V converter circuit 200 is reduced. The capacitance of the power supply 209 can be made smaller than that of the high voltage amplifier circuit 1 of the first embodiment. This allows for miniaturization of the I/V converter circuit 200.

As a result, the high voltage amplifier circuit 1 of the second embodiment yields the same operations and effects as those of the first embodiment. In addition, as the transistor 33 is driven with improved accuracy, the accuracy of the value of the output voltage Vout is improved. Also, the I/V converter circuit 200 and the high voltage amplifier circuit 1 including the converter circuit 200 can be reduced in circuit size.

2. Analyzer Apparatus

Figure 3:
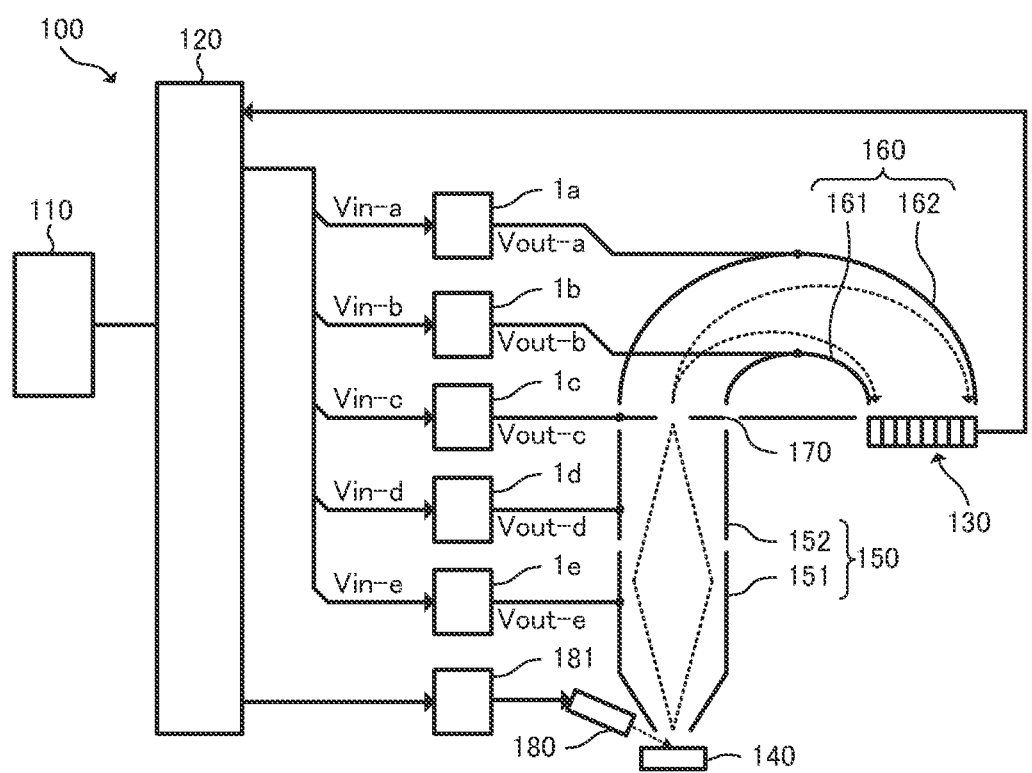
FIG. 3 is a diagram showing one example of the configuration of an electron spectrometer that is one example of an analyzer apparatus.

One example of an analyzer apparatus equipped with the above-described high voltage amplifier circuit 1 is next described. FIG. 3 shows one example of configuration of an electron spectrometer 100 that is one example of the analyzer apparatus equipped with a plurality of high voltage amplifier circuits 1 of the construction described above. Furthermore, the spectrometer 100 has electrostatic lenses 151, 152 to which any one or more of output voltages Vout from the high voltage amplifier circuits 1 are supplied.

As shown in FIG. 3, the electron spectrometer 100 has high voltage amplifier circuits 1a-1e, a controller 120, a detector 130, an input lens 150, an energy analyzer 160, an entrance slit 170, an X-ray source 180, and a power supply unit 181. The electron spectrometer 100 analyzes a sample 140 in response to a manual control signal entered when a user manipulates a computer 110. The X-ray source 180 emits X-rays at the sample 140. As a result, photoelectrons, Auger electrons, and so on are released from the sample 140.

The input lens 150 includes the electrostatic lenses 151 and 152 which focus the electrons (photoelectrons, Auger electrons, etc.) into the entrance slit 170. The entrance slit 170 is located at the entrance of the energy analyzer 160 and operates to limit electrons incident on the energy analyzer 160.

The energy analyzer 160 is operative to energy analyze the electrons released from the sample 140. The energy analyzer 160 is an electrostatic hemispherical analyzer, for example, and has an inner hemispherical electrode 161 and an outer hemispherical electrode 162. A prescribed voltage, for example, is applied between the hemispherical electrodes 161 and 162 to determine an electron pass energy.

The detector 130 detects electrons which have been energy analyzed by the energy analyzer 160, and produces an output signal that is amplified by an amplifier and converted into a digital signal by an A/D converter. The digital signal is then sent to a processing section (not shown) of the controller 120. Alternatively, the output signal from the detector 130 may be amplified by an amplifier in the controller 120 and converted into a digital signal by an A/D converter. The power supply unit 181 sends a control signal to the X-ray source 180 based on an instruction from the controller 120 to cause the X-ray source 180 to produce X-rays.

One high voltage amplifier circuit 1a out of the plural high voltage amplifier circuits 1 amplifies an input voltage Vin-a applied from the controller 120 to thereby generate an output voltage Vout-a of a high voltage of −4 kV to +1 kV, for example, and supplies it to the outer hemispherical electrode 162 of the energy analyzer 160.

Another high voltage amplifier circuit 1b out of the plural high voltage amplifier circuits 1 amplifies an input voltage Vin-b applied from the controller 120 to thereby generate an output voltage Vout-b of a high voltage of −4 kV to +1 kV, for example, and supplies it to the inner hemispherical electrode 161 of the energy analyzer 160.

A further high voltage amplifier circuit 1c out of the plural high voltage amplifier circuits 1 amplifies an input voltage Vin-c applied from the controller 120 to thereby generate an output voltage Vout-c of a high voltage of −4 kV to +1 kV, for example, and supplies it to the entrance slit 170.

A yet high voltage amplifier circuit 1d out of the plural high voltage amplifier circuits 1 amplifies an input voltage Vin-d applied from the controller 120 to thereby generate an output voltage Vout-d of a high voltage of −1 kV to +15 kV, for example, and supplies it to the electrostatic lens 152.

A still other high voltage amplifier circuit 1e out of the plural high voltage amplifier circuits 1 amplifies an input voltage Vin-e applied from the controller 120 to thereby generate an output voltage Vout-e of a high voltage of −1 kV to +15 kV, for example, and supplies it to the electrostatic lens 151.

Where an analysis is performed over an energy range from 0 to 3,000 eV, for example, using the electron spectrometer 100 constructed as described thus far, if the energy range that passes through the energy analyzer 160 is set to 3,000 eV, the energy resolution in the analysis is restricted by the position sensing resolution of the detector 130. In particular, if the detector 130 has 10 channels, for example, it follows that each channel detects energies over a wide range of about 300 eV. This creates the possibility that the resolution necessary for analysis may not be obtained. In the electron spectrometer 100, therefore, an energy range that passes through the energy analyzer 160 is set to on the order of 10 eV, for example. Collection of a spectrum over a wide energy range is accomplished by detecting intensities with the detector 130 while varying the values of voltages supplied to the electrostatic lenses 151, 152, inner hemispherical electrode 161, outer hemispherical electrode 162, and entrance slit 170 according to the energy to be analyzed.

However, where the values of the output voltages Vout-a to Vout-e from the high voltage amplifier circuits 1a-1e are varied, the timing at which there occurs a request for variations of the voltage values delivered from the controller 120 deviates from the timing at which the output voltages Vout-a to Vout-e delivered from the high voltage amplifier circuits 1a-1e to the electrostatic lenses 151, 152, inner hemispherical electrode 161, outer hemispherical electrode 162, and entrance slit 170 reach their given voltage values owing to the responsiveness of the high voltage amplifier circuits 1a-1e. That is, time differences occur. Therefore, if energy conditions for analysis are varied, a wait time is set into the electron spectrometer 100 to secure sufficient time for the output voltages Vout-a to Vout-e from the high voltage amplifier circuits 1a-1e to reach their given voltage values.

On the other hand, in the electron spectrometer 100 of the present embodiment, the output voltages Vout-a to Vout-e from the high voltage amplifier circuits 1a-1e exhibit excellent responsiveness to variations in the values of the input voltages Vin-a to Vin-e. This can shorten the wait time for the values of the output voltages Vout-a to Vout-e from the high voltage amplifier circuits 1a-1e to reach the given voltage values. Consequently, the electron spectrometer 100 of the present embodiment can perform energy analysis faster than in the prior art.

In the present embodiment, the electron spectrometer 100 is exemplified as one example of an analyzer apparatus. Analyzer apparatuses to which the high voltage amplifier circuit or circuits 1 are applicable are not restricted to the electron spectrometer 100 but rather the high voltage amplifier circuits 1 can be applied to various kinds of analyzer apparatuses including mass spectrometers, electron microscopes (such as a scanning electron microscope and a transmission electron microscope), and Auger electron microscopes.

While embodiments and modified embodiments of the present invention have been described thus far, the invention is not restricted thereto. Rather, the invention can be practiced in various aspects without departing from the gist of the invention. For example, the foregoing embodiments can be appropriately combined.

It is to be understood that the present invention embraces configurations (e.g., configurations identical in function, method, and results or identical in purpose and advantageous effects) which are substantially identical to the configurations described in the above embodiments. Furthermore, the invention embraces configurations which are similar to the configurations described in the above embodiments except that their nonessential portions have been replaced. Additionally, the invention embraces configurations which are identical in advantageous effects to, or which can achieve the same object as, the configurations described in the above embodiments. Further, the invention embraces configurations which are similar to the configurations described in the above embodiments except that a well-known technique is added.

The invention claimed is:

1. A high voltage amplifier circuit for amplifying a first voltage signal applied to an input terminal and outputting at an output terminal a second voltage signal having a higher voltage than the first voltage signal, said high voltage amplifier circuit comprising:
   a constant current circuit configured to output a constant current signal at said output terminal;
   an operational amplifier configured to output an amplified control signal based on said first voltage signal; and
   an amplified voltage output circuit configured to output said second voltage signal based on the constant current signal and on the amplified control signal;
   wherein said constant current circuit comprises:
   a light-emitting device having one end supplied with a constant voltage signal provided by a power supply and another end supplied with ground potential;
   a light responsive electricity generating device configured to output a drive signal in response to light emitted by the light-emitting device;
   a first transistor having a first terminal, a second terminal, and a third terminal and operating, in response to the drive signal supplied to the first terminal, to generate the constant current signal based on the amplified voltage signal applied to the second terminal and to output the constant current signal at the third terminal; and
   a current control circuit configured to detect the electrical current value of the constant current signal outputted at the third terminal and control the supply of the drive signal to the first terminal based on the detection.

2. The high voltage amplifier circuit as set forth in claim 1, wherein said amplifier voltage output circuit comprises:
   an I/V converter circuit configured to convert the amplified control current signal based on said amplified control signal into an amplified control voltage signal; and
   a second transistor having a drain terminal electrically connected with said output terminal, the second transistor also having a gate terminal to which the amplified control voltage signal is applied.

3. The high voltage amplifier circuit as set forth in claim 2, wherein said I/V converter circuit comprises an integrated circuit system having an operational amplifier.

4. An analyzer apparatus comprising the high voltage amplifier circuit as set forth in claim 1.

5. The analyzer apparatus as set forth in claim 4, further comprising electrostatic lenses to which said second voltage signal is supplied.

* * * * *